United States Patent
Xiang et al.

(10) Patent No.: US 11,955,580 B2
(45) Date of Patent: Apr. 9, 2024

(54) QUANTUM DOT LIGHT EMITTING DIODE, PREPARATION METHOD THEREOF, AND COMPOSITE MATERIAL

(71) Applicant: TCL TECHNOLOGY GROUP CORPORATION, Huizhou (CN)

(72) Inventors: Chaoyu Xiang, Huizhou (CN); Xiongzhi Wang, Huizhou (CN); Le Li, Huizhou (CN); Tao Zhang, Huizhou (CN); Zhenghang Xin, Huizhou (CN); Xue Li, Huizhou (CN)

(73) Assignee: TCL TECHNOLOGY GROUP CORPORATION, Huizhou (CN)

( * ) Notice: Subject to any disclaimer, the term of this patent is extended or adjusted under 35 U.S.C. 154(b) by 835 days.

(21) Appl. No.: 16/954,465

(22) PCT Filed: Dec. 29, 2018

(86) PCT No.: PCT/CN2018/125202
§ 371 (c)(1),
(2) Date: Jun. 16, 2020

(87) PCT Pub. No.: WO2019/129256
PCT Pub. Date: Jul. 4, 2019

(65) Prior Publication Data
US 2021/0083144 A1    Mar. 18, 2021

(30) Foreign Application Priority Data

Dec. 29, 2017 (CN) .......................... 201711468582.6
Dec. 29, 2017 (CN) .......................... 201711468616.1
(Continued)

(51) Int. Cl.
*H01L 33/06* (2010.01)
*H01L 33/14* (2010.01)

(52) U.S. Cl.
CPC .............. *H01L 33/06* (2013.01); *H01L 33/14* (2013.01)

(58) Field of Classification Search
CPC ...... H01L 33/14; H10K 50/115; H10K 50/80; H10K 50/15; H10K 50/16
See application file for complete search history.

(56) References Cited

U.S. PATENT DOCUMENTS 10,157,966 B2 *  12/2018  Kam ................... H10K 50/131
10,374,158 B2 *   8/2019  Ning .................... H10K 50/16
(Continued)

FOREIGN PATENT DOCUMENTS

CN    101882665 A    11/2010
CN    106384787 A    2/2017
(Continued)

OTHER PUBLICATIONS

English Translation of International Search Report for Application No. PCT/CN2018/125202.
(Continued)

*Primary Examiner* — Savitri Mulpuri
(74) *Attorney, Agent, or Firm* — CANTOR COLBURN LLP

(57) ABSTRACT

A quantum dot Light Emitting Diode, including an anode, a cathode, and a quantum dot light-emitting layer between the anode and the cathode, a carrier functional layer is arranged between the anode and the cathode. The carrier functional layer contains a magnetic material.

15 Claims, 6 Drawing Sheets

↓ applying an external field (30) Foreign Application Priority Data

Dec. 29, 2017 (CN) .......................... 201711468692.2
Dec. 29, 2017 (CN) .......................... 201711468934.8

(56) References Cited

U.S. PATENT DOCUMENTS

| | | | |
|---|---|---|---|
| 10,566,563 B2 * | 2/2020 | Chen ...................... | C09K 11/06 |
| 10,826,009 B2 * | 11/2020 | Liang ...................... | H01L 33/06 |
| 11,335,873 B2 * | 5/2022 | Cheng .................... | H10K 71/00 |
| 2018/0331312 A1 * | 11/2018 | Pan ........................ | C09D 11/38 |

FOREIGN PATENT DOCUMENTS

| | | | |
|---|---|---|---|
| JP | 2004296224 A | 10/2004 | |
| JP | 2008166034 A | 7/2008 | |

OTHER PUBLICATIONS

International Search Report for Application No. PCT/CN2018/125202.
Written Opinion for Application No. PCT/CN2018/125202.

\* cited by examiner

QUANTUM DOT LIGHT EMITTING DIODE, PREPARATION METHOD THEREOF, AND COMPOSITE MATERIAL

CROSS-REFERENCE TO RELATED APPLICATION

The present application is a 35 U.S.C. § 371 national stage application of PCT Application Ser. No. PCT/CN2018/125202, filed on Dec. 29, 2018, which claims priority to the following Chinese patent applications; No. 201711468582.6, No. 201711468934.8, No. 201711468616.1, and No. 201711468692.2, each filed on Dec. 29, 2017, the entire contents each of which are incorporated herein by reference in their entireties.

TECHNICAL FIELD

The present disclosure relates to the field of display technology, and in particular to a quantum dot Light Emitting Diode, a preparation method thereof, and a composite material.

BACKGROUND

Quantum Dot Light Emitting Diodes (QLED) is a light-emitting device based on inorganic nanocrystalline quantum dot material. Due to the advantages of adjustable wavelength, narrow emission spectrum, high stability, high electroluminescence quantum yield, etc., QLED become a strong competitor of the next generation display technology. Generally, in a QLED device with a multi-layer structure, the problem of carrier balance is an important point that affects its luminous efficiency. In general, the transportable holes arrive at the quantum dot light-emitting layer from the anode through the hole injection layer and the hole transport layer, and recombine with electrons transferred from the cathode through the electron injection layer and the electron transport layer to form excitons, and then the excitons emit photons. It is worth noting that too many holes or electrons will produce three-particle systems and thus cause the generated excitons to quench, thereby reducing the luminous efficiency and stability of the device. Therefore, in different types of devices, changing carrier mobility and improving the carrier injection balance are effective methods to improve the efficiency and stability of the device.

In recent years, due to the advantages of high precision, mask free, non-contact, on-demand printing, etc., inkjet printing technology has attracted extensive attention. Where, making optoelectronic devices based on solution functional material and advanced inkjet printing equipment can effectively improve material utilization, reduce costs, and improve production efficiency. However, the core problem of this technology is that inkjet printing equipment has high requirements for ink, including chemical composition, physical properties, configuration methods, pre-printing and post-printing processing methods, etc., which brings great challenges to ink preparation. In addition, it is necessary to consider whether the ink will cause physical or chemical changes and damage to other structures of the device.

Technical Problem

The objective of the present disclosure is to provide a quantum dot Light Emitting Diode, a preparation method thereof, and a composite material, aiming to solve the technical problem of unbalanced carrier injection in the existing quantum dot Light Emitting Diode device, which affects the luminous efficiency and stability of the device.

Technical Solution

In order to achieve the above objective, the technical solution adopted by the present disclosure is as follows:

A quantum dot Light Emitting Diode, includes an anode, a cathode, and a quantum dot light-emitting layer between the anode and the cathode. A carrier functional layer is arranged between the anode and the cathode, and the carrier functional layer contains a magnetic material.

A preparation method of quantum dot Light Emitting Diode, includes the following steps:

providing a substrate; and preparing a carrier functional layer on the substrate, where the carrier functional layer contains a magnetic material.

A composite material is comprised of a carrier functional material and a magnetic material.

Beneficial Effect

The quantum dot Light Emitting Diode according to the present disclosure is provided with a unique carrier functional layer. The carrier functional layer contains a magnetic material, the magnetic material is capable of adjusting the carrier mobility (such as hole mobility or electron mobility), so as to improve the carrier injection balance, therefore, the luminous efficiency and stability of the device can be effectively improved by providing the carrier functional layer in the quantum dot Light Emitting Diode device.

According to the preparation method of Quantum dot Light Emitting Diode provided by the present disclosure, the carrier functional layer containing magnetic material is directly prepared on a substrate, the process is simple and easy to implement, and the final device can improve the carrier injection balance, therefore, it has a good luminous efficiency and stability.

The composite material according to the present disclosure is comprised of carrier functional material and magnetic material. The magnetic material is capable of adjusting the carrier mobility (such as electron mobility), so as to improve the carrier injection balance, therefore, the composite material can be well used for preparing electron functional layer (at this time, the carrier functional material is electron functional material) or hole functional layer (at this time, the carrier functional material is hole functional material) of the QLED device, which can effectively improve the luminous efficiency and stability of the device.

DESCRIPTION OF THE DRAWINGS

FIG. 2 (a) schematically shows the structure of a QLED device according to an embodiment of the present disclosure;

FIG. 2 (b) schematically shows the structure of a QLED device according to an embodiment of the present disclosure;

FIG. 3 (a) schematically shows the structure of a QLED device according to an embodiment of the present disclosure;

FIG. 3 (b) schematically shows the structure of a QLED device according to an embodiment of the present disclosure;

FIG. 3 (c) schematically shows the structure of a QLED device according to an embodiment of the present disclosure;

FIG. 4 (a) schematically shows the structure of a QLED device according to an embodiment of the present disclosure;

FIG. 4 (b) schematically shows the structure of a QLED device according to an embodiment of the present disclosure;

FIG. 5 (a) schematically shows the structure of a QLED device according to an embodiment of the present disclosure;

FIG. 5 (b) schematically shows the structure of a QLED device according to an embodiment of the present disclosure;

FIG. 5 (c) schematically shows the structure of a QLED device according to an embodiment of the present disclosure;

FIG. 6 (a) schematically shows the structure of a QLED device according to an embodiment of the present disclosure;

FIG. 6 (b) schematically shows the structure of a QLED device according to an embodiment of the present disclosure;

DETAILED DESCRIPTION OF THE EMBODIMENTS

In order to make the technical problems to be solved, technical solutions and beneficial effects clearer, the present disclosure will be further described in detail below in combination with the drawings and examples. It should be understood that the specific examples described herein are only used to explain the present disclosure, and are not intended to limit the present disclosure.

When a carrier moves in the magnetic field, it will be deflected by the action of the magnetic force and the scattering force of magnetons, which will change its trajectory, thereby changing the carrier mobility. In magnetic materials, due to the existence of long-range ordered magnetic moments, the motion of the carrier will be affected by the scattering of magnetons, phonons, and ferromagnetic/nonmagnetic interfaces, thereby changing the carrier mobility. Therefore, in the embodiments of the present disclosure, a magnetic material is introduced into the QLED device to change the carrier mobility, so as to improve the carrier injection balance in the device, thereby improving the efficiency and stability of the device. Specifically, by introducing a surface modifier, controlling the composition of ink, and adding an ink regulator, a magnetic material-containing ink suitable for inkjet printing is prepared. This magnetic material-containing ink can be used to improve the efficiency of the device after being applied to a photoelectric conversion device. Specifically, in the embodiments of the present disclosure, the magnetic material is used to change the carrier mobility, the carrier injection balance in the QLED device is improved by doping the electron functional layer (i.e., electron injection layer, electron transport layer, or electron injection layer and electron transport layer) or the hole functional layer (i.e., hole injection layer, hole transport layer, or hole injection layer and hole transport layer) to introduce a magnetic material, and introducing a magnetic layer comprised of a magnetic material (i.e., electron adjustment layer or hole adjustment layer) at the interface of each functional layer, thereby improving the luminous performance and stability of the device.

Specifically, the working principles of the magnetic material:

a) In an aspect, the magnetic material is configured for changing the carrier mobility.

After applying an electric field to a QLED device made of functional layers containing magnetic material, carriers move in the direction of the electric field under the effect of electric field force, but at this time, some carriers will be affected by material impurity or defect scattering, and phonon scattering, to change their trajectory, thereby causing a change in carrier mobility. At the same time, the degree of change is closely related to factors such as temperature and the number of impurities or defects. When an external magnetic field is present, carriers will be affected by the Lorentz force during movement to deflect their trajectory, therefore, the carriers accumulate on both sides to form an electric field (Hall effect), resulting in a change in carrier mobility. For magnetic materials, the spontaneously existing magnetons will scatter the carriers to cause the deflection of trajectory, thereby causing the carrier mobility to change. In ferromagnetic materials, the carrier mobility can vary by as much as 2 to 3 orders of magnitude due to the existence of various scattering effects, and the quantum dot Light Emitting Diode device exists the problem of injection imbalance due to different carrier mobility, therefore, the carrier mobility can be adjusted by introducing a magnetic material into the quantum dot Light Emitting Diode device, thereby improving the carrier injection balance and improving the efficiency of the device.

b) In another aspect, the magnetic material is configured for changing the vacuum level.

When a magnetic material is used as a magnetic layer (ML) at the interface of each functional layer of a QLED device, that is, an electron adjustment layer or a hole adjustment layer according to embodiments of the present disclosure, since the magnetic moments of the magnetic material differ in magnitude and orientation, carriers need to overcome different barrier heights when passing through the interface, thereby causing the vacuum level to change. Generally, in QLED devices, changing the vacuum level can reduce the injection barrier of carriers (such as electrons or holes), so as to improve the carrier injection balance in the device, thereby improving the efficiency and stability of the device.

Magnetic materials can be divided into two types, one is conductive magnetic material and the other is insulating magnetic material. By controlling the magnitude and orientation of the magnetic moments of the magnetic material, the vacuum level of the interface is changed, thereby adjusting the barrier height to be overcome when carriers pass through the interface, so as to achieve the effect of improving the carrier injection balance, thereby improving the efficiency and stability of the device. In the preparation method, a vacuum process can be adopted to prepare common ferromagnetic materials, such as molecular beam epitaxy, physical vapor deposition, magnetron sputtering, and nanoparticle beam composite deposition method. But for insulating magnetic materials, methods such as vulcanization, extrusion, calendering, and injection molding can be used.

c) In a further aspect, the applied external field affects the magnetic material.

Figure 1:
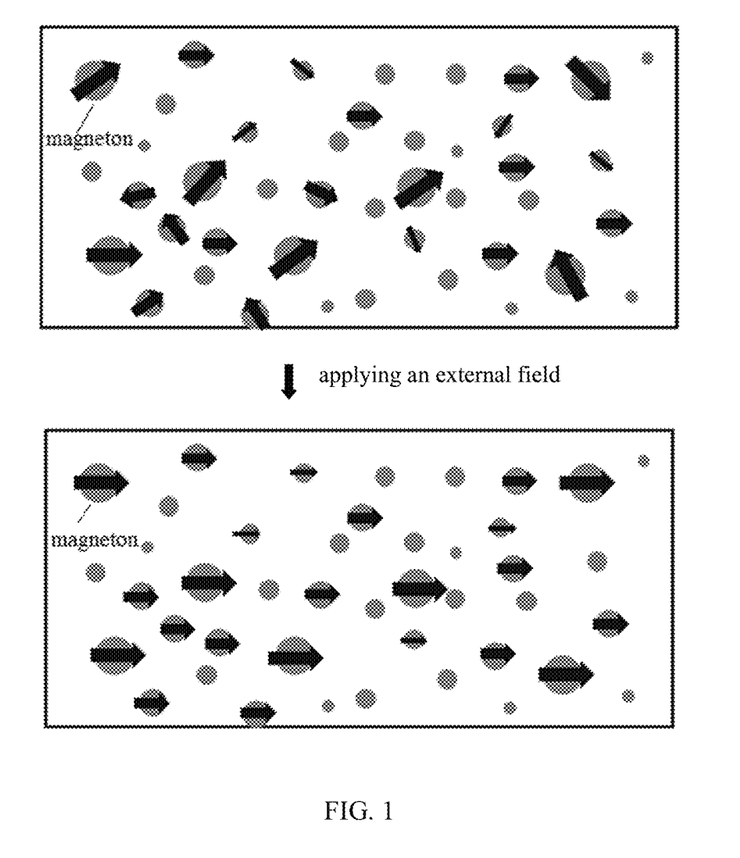
FIG. 1 schematically shows a change in the magnetic moment direction of the magnetic material according to the present disclosure before and after the application of an external field.

When the magnetic material is dispersed in the electron functional layer or hole functional layer with particle size, the particles are magnetized after the external field is applied, and the magnetic moments are aligned in the direction of the magnetic field. At this time, the direction of the magnetic moments of the magnetic material remains unchanged (such as FIG. 1) when the external magnetic field is removed. The direction of the magnetic moments in the thin film changes with the change of the external field, and the carrier mobility also changes. Therefore, an external field can be applied to improve the carrier injection balance and optimize the device performance.

The magnetic material in the embodiments of the present disclosure includes a conductive magnetic material, or an insulating magnetic material, or a conductive magnetic material and an insulating magnetic material. The conductive magnetic material is at least one selected from a group consisting of elemental iron, an iron alloy, an iron oxide, elemental cobalt, a cobalt alloy, a cobalt oxide, elemental nickel, a nickel alloy, and a nickel oxide, in other words, the conductive magnetic material may include any one or more materials selected from the group consisting of elemental iron, an iron alloy, an iron oxide, elemental cobalt, a cobalt alloy, a cobalt oxide, elemental nickel, a nickel alloy, and a nickel oxide, for example, an iron alloy; a cobalt alloy, and a cobalt oxide; a cobalt oxide, elemental nickel, and a nickel alloy; elemental iron, an iron alloy, an iron oxide, and elemental cobalt, ect. The insulating magnetic material is at least one selected from a group consisting of a ferrite and a magnetic rubber, that is, the insulating magnetic material may be a ferrite, or a magnetic rubber, or a ferrite and a magnetic rubber. Based on the action principle of the magnetic material, in the embodiments of the present disclosure, the carrier injection balance in the QLED device is improved by doping the electron functional layer (i.e., electron injection layer, electron transport layer, or electron injection layer and electron transport layer) or the hole functional layer (i.e., hole injection layer, hole transport layer, or hole injection layer and hole transport layer) to introduce a magnetic material, and introducing a magnetic layer comprised of a magnetic material (i.e., electron adjustment layer or hole adjustment layer) at the interface of each functional layer, thereby improving the luminous performance and stability of the device. This is explained in detail below.

On the one hand, in an embodiment of the present disclosure, a quantum dot Light Emitting Diode is provided, including an anode, a cathode, and a quantum dot light-emitting layer between the anode and the cathode, and a carrier functional layer containing a magnetic material is arranged between the anode and the cathode.

The quantum dot Light Emitting Diode provided by the embodiments of the present disclosure is provided with a unique carrier functional layer which contains a magnetic material, the magnetic material is capable of adjusting the carrier mobility (such as hole mobility or electron mobility), so as to improve the carrier injection balance, therefore, the luminous efficiency and stability of the device can be effectively improved by providing the carrier functional layer in the quantum dot Light Emitting Diode device.

Figure 2:
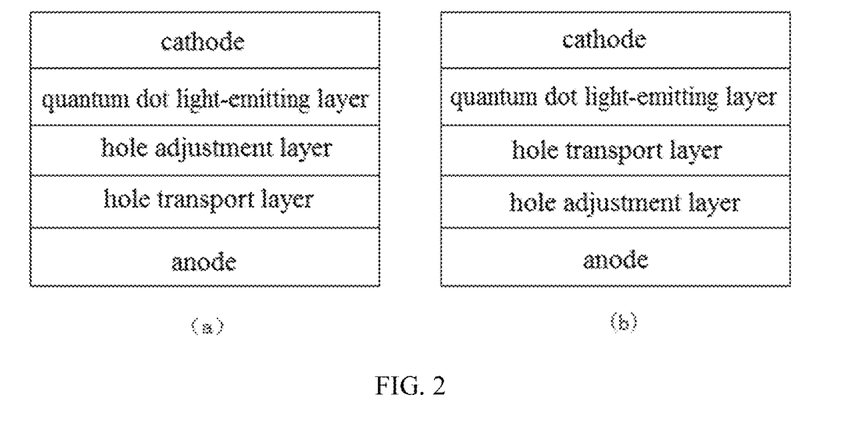
Figure 3:
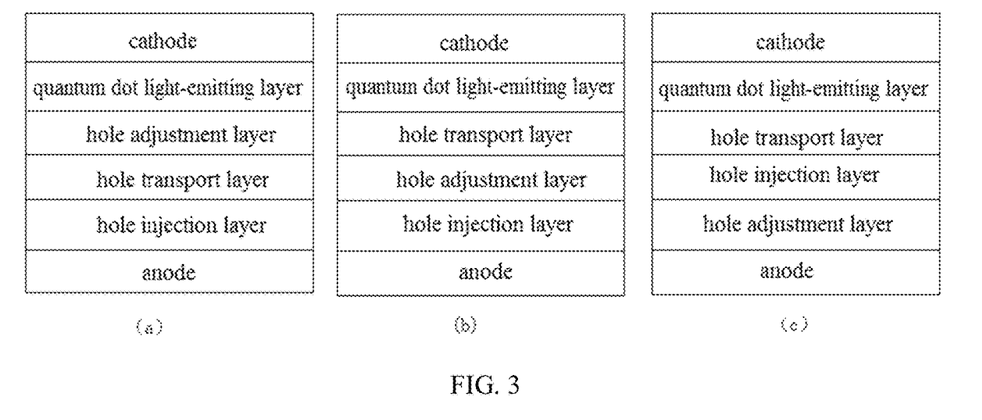

Specifically, the magnetic material is made into a hole adjustment layer or an electron adjustment layer. In an embodiment of the present disclosure, a quantum dot Light Emitting Diode includes an anode, a cathode, and a quantum dot light-emitting layer between the anode and the cathode, the carrier functional layer, i.e. the hole adjustment layer, is further arranged between the anode and the quantum dot light-emitting layer, and the hole adjustment layer contains a magnetic material. Further, a hole transport layer is arranged between the anode and the quantum dot light-emitting layer, and the hole adjustment layer is located between the anode and the hole transport layer (as shown in FIG. 2b), or the hole adjustment layer is located between the hole transport layer and the quantum dot light-emitting layer (as shown in FIG. 2a). Alternatively, a hole injection layer and a hole transport layer are stacked between the anode and the quantum dot light-emitting layer, the hole injection layer is adjacent to the anode, and the hole transport layer is adjacent to the quantum dot light-emitting layer, the hole adjustment layer is located between the anode and the hole injection layer (as shown in FIG. 3c), or the hole adjustment layer is located between the hole injection layer and the hole transport layer (as shown in FIG. 3b), or the hole adjustment layer is located between the hole transport layer and the quantum dot light-emitting layer (as shown in FIG. 3a). In an embodiment, when the hole adjustment layer is made of a conductive magnetic material, the thickness of the hole adjustment layer is 1-10 nm; in another embodiment, when the hole adjustment layer is made of an insulating magnetic material, the thickness of the hole adjustment layer is 1-5 nm.

Figure 4:
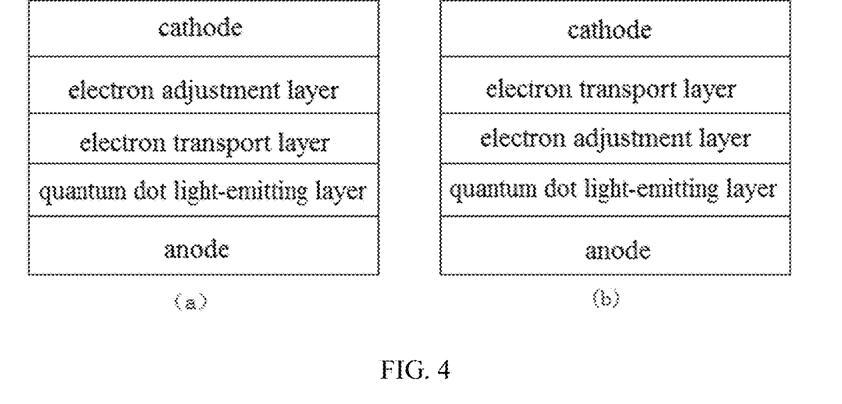
Figure 5:
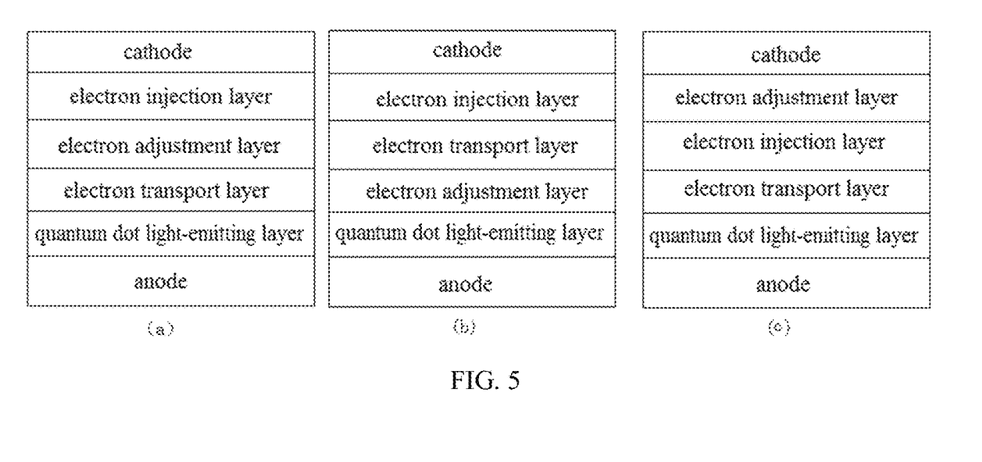

In another embodiment, a quantum dot Light Emitting Diode includes an anode, a cathode, and a quantum dot light-emitting layer between the anode and the cathode, the carrier functional layer, i.e. the electron adjustment layer, is further arranged between the cathode and the quantum dot light-emitting layer, and the electron adjustment layer contains a magnetic material. Further, an electron transport layer is arranged between the cathode and the quantum dot light-emitting layer, the electron adjustment layer is located between the cathode and the electron transport layer (as shown in FIG. 4a), or the electron adjustment layer is located between the electron transport layer and the quantum dot light-emitting layer (as shown in FIG. 4b). Alternatively, an electron injection layer and an electron transport layer are stacked between the cathode and the quantum dot light-emitting layer, the electron injection layer is adjacent to the cathode, and the electron transport layer is adjacent to the quantum dot light-emitting layer, the electron adjustment layer is located between the cathode and the electron injection layer (as shown in FIG. 5c), or the electron adjustment layer is located between the electron injection layer and the electron transport layer (as shown in FIG. 5a), or the electron adjustment layer is located between the electron transport layer and the quantum dot light-emitting layer (as shown in FIG. 5b). Furthermore, a hole adjustment layer is further arranged between the anode and the quantum dot light-emitting layer, and the hole adjustment layer contains a magnetic material. In an embodiment, when the electron adjustment layer is made of a conductive magnetic material, the thickness of the electron adjustment layer is 1-10 nm; in another embodiment, when the electron adjustment layer is made of an insulating magnetic material, the thickness of the electron adjustment layer is 1-5 nm.

When the magnetic material is used as the interface in the QLED device, since the magnetic moments of the magnetic material differ in magnitude and orientation, carriers need to overcome different barrier heights when passing through the interface, which causes the vacuum level to change, and changing the vacuum level can reduce the injection barrier of carriers (such as electrons or holes), so as to improve the carrier injection balance in the QLED device, thereby improving the efficiency and stability of the device.

In QLED light-emitting devices, there are different numbers of hole carriers and electron carriers in the light-emitting layer due to unbalanced carrier injection, which causes the extra electrons or holes to quench the excitons, thereby reducing the luminous efficiency of the device. Therefore, it is possible to improve the carrier injection balance and reduce exciton quenching by reducing the carrier mobility and injection, thereby improving the luminous performance and stability of the device. The magnetic moment existing in the magnetic material exerts a strong force (Lorentz force) on the carrier, and the magnitude of the force can be adjusted by the magnetic moment of different sizes and directions, thereby adjusting the carrier mobility. For the same number of carriers, when the orientation of the magnetic moment is perpendicular to the direction of carrier motion, the force is the largest, when the orientation of the magnetic moment is parallel to the direction of carrier motion, the force is the smallest. At the same time, a magnetic moment of different magnitude itself also exerts a force of different magnitude on the carrier. The greater the magnetic moment is, i.e. the stronger the saturation magnetization of magnetic moment is, the greater the force is; otherwise, the smaller the force is. The magnitude and orientation of the magnetic moment can be controlled by the magnitude and orientation of the external magnetic field. That is, if an external magnetic field is applied, the magnetic material will be further magnetized to form an orientation parallel to the direction of the magnetic field, and its magnetization intensity will further increase. When the external magnetic field is removed, the orientation and magnitude of the magnetic moment inside the magnetic material will not decay rapidly, but will be retained. Therefore, this method is used to adjust the magnitude and orientation of the magnetic moment, so as to adjust the magnitude of force on the carrier, thereby controlling the change amount of the carrier.

When the magnetic layer is used as a magnetic layer at the interface of each functional layer of the device, placed between HIL (hole injection layer) and HTL (hole transport layer), between HTL and EML (quantum dot light-emitting layer), between EML and ETL (electron transport layer), between EIL (electron injection layer) and ETL, and between the electrode and HIL/EIL, it can be a single-layer structure or a multi-layer structure. The material of magnetic layer includes, but is not limited to, a conductive magnetic material and an insulating magnetic material, the conductive magnetic material can be, for example, Fe, Co, Ni and other transition metals, their alloys, and their oxides, the insulating magnetic material can be, for example, sintered ferrite and magnetic rubber. Further, for the conductive magnetic material, the thickness of the magnetic layer is controlled to be 1-10 nm. When the thickness of the conductive magnetic material is relatively large, the carrier injection barrier will be significantly enhanced, resulting in a decrease in carrier density, therefore, the number of exciton recombination in the quantum dot light-emitting layer is greatly reduced, which excesses the effect of carriers reduction on exciton quenching, that is, the luminous efficiency is reduced. Further, for the insulating magnetic material, the thickness of the magnetic layer is controlled to be 1-5 nm. When the thickness of the insulating magnetic material is relatively large, the carrier cannot effectively tunnel, resulting in device disconnection or significantly reduced carrier mobility. Furthermore, for the magnetic material of the magnetic layer, due to its thin thickness, strong magnetic moment and specific orientation, it is required that the particle size of the magnetic material in the magnetic layer is uniform and the distribution of magnetic moment is uniform, so as to facilitate applying an external magnetic field to adjust and control the magnitude and orientation of magnetization of magnetic moment, thereby changing the carrier mobility and injection barrier. Common preparation methods are divided into a physical method and a chemical method, the chemical method includes chemical vapor deposition, continuous ion layer adsorption and reaction, anodizing, electrodeposition, and coprecipitation, and the physical method includes physical coating method or solution method. The physical coating method includes thermal evaporation coating, electron beam evaporation coating, magnetron sputtering, multi-arc ion coating, physical vapor deposition, atomic layer deposition, and pulse laser deposition. The solution method includes blade coating, dip-coating, dipping, spray coating, roll coating, casting, slit coating, and strip coating.

On the other hand, an embodiment of the present disclosure provides a composite material, the composite material is comprised of a carrier functional material and a magnetic material.

The composite material provided by the embodiments of the present disclosure is comprised of a carrier functional material and a magnetic material. The magnetic material is capable of adjusting the carrier mobility (such as electron mobility), so as to improve the carrier injection balance, therefore, the composite material can be well used for preparing electron functional layer (at this time, the carrier functional material is electron functional material) or hole functional layer (at this time, the carrier functional material is hole functional material) of the QLED device, which can effectively improve the luminous efficiency and stability of the device.

In the composite material, the magnetic material is dispersed in the carrier functional material, or the magnetic material is coated on the surface of the carrier functional material to form a core-shell structure, of which the inner core is the carrier functional material and the shell is the magnetic material.

In an embodiment of the present disclosure, a composite material is provided. The composite material is comprised of an electron functional material and a magnetic material. Where the electron functional material is an electron injection material or an electron transport material. The magnetic material in the composite material is capable of adjusting the electron mobility, thereby improving the carrier injection balance. Therefore, the composite material can be well used to prepare the electron injection layer or electron transport layer of the QLED device, which can effectively improve the luminous efficiency and stability of the device.

Figure 6:
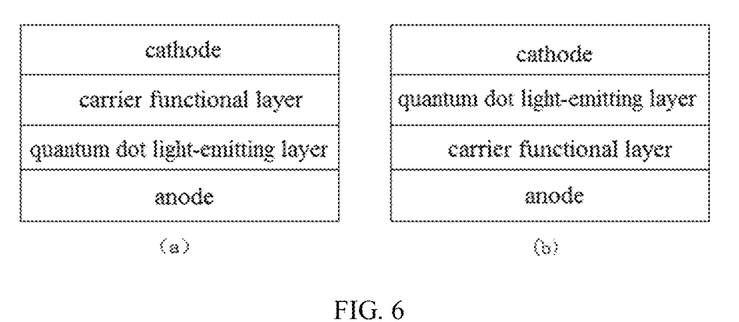

Correspondingly, a QLED device is provided, including an anode, a cathode, and a quantum dot light-emitting layer between the anode and the cathode. A carrier functional layer is arranged between the cathode and the quantum dot light-emitting layer, as shown in FIG. 6a, the carrier functional layer is an electron functional layer, and the electron functional layer contains an electron functional material and a magnetic material. Where the electron functional material is an electron injection material or an electron transport material.

In another embodiment of the present disclosure, a composite material is provided. The composite material is comprised of a hole functional material and a magnetic material. Where the hole functional material is a hole injection material or a hole transport material. The magnetic material in the composite material is capable of adjusting the hole mobility, thereby improving the carrier injection balance. Therefore, the composite material can be well used to prepare the hole injection layer or hole transport layer of the QLED device, which can effectively improve the luminous efficiency and stability of the device.

Accordingly, a QLED device includes an anode, a cathode, and a quantum dot light-emitting layer between the anode and the cathode. A functional layer is arranged between the anode and the quantum dot light-emitting layer, as shown in FIG. 6b, the carrier functional layer is a hole functional layer, and the hole functional layer contains a hole functional material and a magnetic material. Where the hole functional material is a hole injection material or a hole transport material. Furthermore, an electron functional layer is further arranged between the cathode and the quantum dot light-emitting layer of the QLED device, the electron functional layer contains an electron functional material and a magnetic material. Where, the electron functional material is an electron injection material or an electron transport material.

Specifically, the magnetic material is doped to the hole transport material or electron transport material to manufacture HTL or ETL. The magnetic-material-doped transport layer is capable of adjusting the carrier mobility by changing the composition and particle size of the magnetic material, and other factors, thereby improving the carrier injection balance and improving the luminous efficiency of the device. The composition of the magnetic material (that is, the volume fraction of the magnetic material in the magnetic transport layer) is adjusted to control the total number of magnetic moments exerting force on the carrier in the transport layer, thereby controlling the carrier mobility. The particle size of the magnetic material is adjusted, that is, the magnitude of the single magnetic moment connected with each other is adjusted, to control the magnitude of the force exerted on the carrier by the single magnetic moment, thereby controlling the carrier mobility. The magnetic material can be selected from conductive magnetic materials, such as 3d-transition metal elements, such as Fe, CO, Ni, etc., their alloys, and their oxides, while ETL can select a more common N-type semiconductor inorganic electron transport material such as ZnO, $TiO_2$, $SnO_2$, etc., and HTL can select a P-type inorganic semiconductor hole transport material such as $MoO_3$, $V_2O_5$, $WO_3$, etc., and other organic hole/electron transport materials. Further, when the magnetic material is located on a side of the electron transport layer as a magnetic layer, to match the electron transport material, an N-type semiconductor magnetic metal oxide material, such as triiron tetraoxide ($Fe_3O_4$), is preferred. When the magnetic material is located on a side of the hole transport layer as a magnetic layer, to match the hole transport material, a P-type semiconductor magnetic metal oxide material, such as nickel oxide, is preferred.

The preparation methods of the magnetic-material-doped HTL or ETL are mainly divided into a physical method and a chemical method. A vacuum co-sputtering preparation method may be adopted to co-sputter the inorganic semiconductor material and the magnetic material to prepare a magnetic nanoparticle composite thin film material. For the co-sputtering method, the composition of the magnetic material can be adjusted by controlling the power of different targets. Further, the volume fraction of the magnetic material doped in each functional layer (such as HIL, HTL, EML, or EIL) is 0.5-30%, and the optimal value is 20%. When the content of the magnetic material is too high, the carrier mobility will sharply decrease, which results in a mismatch in the number of carriers in the light-emitting layer, thereby resulting in exciton quenching and reducing the luminous efficiency. The size of the magnetic nanoparticle can be adjusted by controlling the gas flow inlet. Generally, the particle size of the magnetic material can be controlled to be about 8-15 nm. If the particle size is too large, the interaction force between the particles is too strong, which affects carrier transport in the substrate material; if the particle size is small, the magnetic moment intensity of the particle is weak, and the effect of controlling the carrier mobility cannot be achieved. The thickness of the film layer is adjusted by controlling the sputtering time. Further, the thickness of each functional layer is generally controlled to be 20-40 nm, and the optimal value is 30 nm. When the thickness of the film layer is thick, it will cause carrier loss and increase the turn-on voltage of the device; when the film layer is thin, it is difficult for the magnetic nanoparticles to be completely encapsulated in the substrate material, which causes the carrier to pass the layer directly, thereby failing to achieve the purpose of adjustment and control. At the same time, in order to ensure the stability of the magnetic material, its binding force should be firm and the material density should be moderate. Optionally, the saturation magnetization of the magnetic material should be greater than 80 emu/g, so as to facilitate the adjustment of the force exerted by magnetic moments on the carrier.

Doping forms of the magnetic material: co-dispersed structure and core-shell structure.

Magnetic materials can adjust the carrier mobility. Because different magnetic materials combined with P-type/N-type semiconductors can form structures with different sizes and different specific surface areas, they exert forces of different magnitudes on carriers. We divide the structure of the magnetic material into the following two categories according to different positions of the magnetic material in the structure: A) Co-dispersed structure and B) core-shell structure. That is, the magnetic material can be dispersed in the electron functional material (electron injection material/electron transport material) or the hole functional material (hole injection material/hole transport material), or the magnetic material is coated on the surface of the electron functional material (electron injection material/electron transport material) or the hole functional material (hole injection material/hole transport material), so as to form a core-shell structure, of which the inner core is the electron/hole functional material and the shell is the magnetic material.

The magnetic metal nanoparticle composite material with a co-dispersed structure is comprised of magnetic nanoparticles and other P-type/N-type semiconductor particles. When the carrier passes through the material, there are two transport routes. A first transport route is to pass directly through the non-magnetic particles, at this time, the carrier is less affected by the force exerting by magnetic moments, even without force; a second transport route is to pass through the non-magnetic particles and the magnetic particles, at this time, the carrier is subjected to a large force exerting by magnetic moments. In a magnetic composite material with a co-dispersed structure, the above two carrier transport routes coexist, and jointly adjust the carrier mobility.

For a magnetic composite material with a core-shell structure, when the magnetic material is coated on non-magnetic particles, in comparison with the co-dispersed structure magnetic material, the carrier transport route is only the above-mentioned second route, at this time, the force the carrier subjected to is relatively increased. For the core-shell structure, the magnetic material can be fully coated on the non-magnetic material or partially coated on the non-magnetic material, at this time, with respect to the force the carrier subjected to during transport, the former is obviously greater than the latter. For the full-coated and semi-coated core-shell structures, the magnitude of the force exerting by magnetic moments on the carrier is also related to the thickness of the magnetic material shell. The greater the thickness of the magnetic metal shell is, the stronger the magnetic moments are, the greater the force is, at this time, the change amount of the carrier mobility is greater; when the thickness of the magnetic material shell is thin, the magnetic moment intensity is relatively small, at this time, the force is small, and the change amount of the carrier mobility decreases.

For the above two magnetic materials with a co-dispersed structure and a core-shell structure, the magnetic material can optionally be selected from 3d-transition metal elements such as Fe, CO, Ni, etc., their alloys, and their oxides.

When a magnetic composite material is used for hole transport in QLED devices, the base of the magnetic composite material with a co-dispersed structure must be a hole transport material, which can be an organic hole transport material or a P-type semiconductor. While for the magnetic composite material with a core-shell structure, the inner core of which is a corresponding P-type semiconductor, and the shell of which is optionally a P-type semiconductor magnetic metal oxide, such as nickel oxide. The above-mentioned hole transport material can be selected from P-type inorganic semiconductor materials, such as $MoO_3$, $V_2O_5$, $WO_3$, etc., and an organic material, such as PEDOT, TFB, PVK, NPB, Poly-TPD, etc.

When the magnetic composite material is used for electron transport in QLED devices, the base of the magnetic composite material with a co-dispersed structure must be an electron transport material, which can be an organic electron transport material or a N-type semiconductor. While for the magnetic composite material with a core-shell structure, the inner core of which is a corresponding N-type semiconductor, and the shell of which is optionally a N-type semiconductor magnetic metal oxide, such as triiron tetraoxide. The above-mentioned electron transport material can be selected from N-type inorganic semiconductor materials, such as ZnO, $TiO_2$, etc., and an organic material, such as TAZ, PBD, etc.

For the co-dispersed structure, magnetic metal nanoparticles are embedded in the non-magnetic carrier transport base material to form a particle-film co-dispersed structure. At this time, the volume fraction of the magnetic material in the composite material is about 0.5%-30%, the particle size of the magnetic material can be controlled to be about 8-15 nm, and the thickness of the film layer is generally controlled to be 20-40 nm.

For the core-shell structure, the carrier transport material is used as the core, and the magnetic material is used as the shell to coat the transport material. At this time, the volume fraction of the magnetic material in the composite material is about 0.5%-30%, the entire particle size of the core-shell structure can be controlled at about 8-15 nm, and the thickness of the film layer is generally controlled to be 20-40 nm. In addition, the size of the semiconductor core is controlled to be about 3-8 nm, and the thickness of the shell is controlled to be about 1-12 nm. By controlling the size of the semiconductor core and the thickness of the shell, the magnitude of force exerting by magnetic moments on the carrier can be adjusted.

For the magnetic composite material with a co-dispersed structure, it can be prepared by co-sputtering, co-evaporation, chemical vapor deposition, or the like. Taking co-sputtering as an example, a magnetic metal iron target and a P-type semiconductor ZnO target are selected, and a magnetic metal nanoparticle film with a co-dispersed structure is deposited and prepared by co-sputtering in a same chamber. A series of parameters, such as the particle size of ZnO, the particle size of Fe, the composition of magnetic material, the thickness of film layer, etc., are controlled by controlling the flow of inert gas, power supply, sputtering pressure, and deposition time.

For the magnetic composite material with a core-shell structure, it can be prepared by chemical synthesis, nanoparticle beam deposition, or the like. Taking nanoparticle beam composite thin film deposition as an example (as in Example 1), the magnetron sputtering equipment is provided with two chambers in total, i.e., a deposition chamber and a sputtering chamber. For the preparation of core material in the sputtering chamber, the size of the core can be adjusted by controlling the parameters such as the power to the target, the gas flow, and the filter tube diameter. The prepared core material then flows to the deposition chamber through the filter connected between the two chambers under the pressure difference. At this time, a magnetron sputtering target is also installed on the flight path of the core material in the deposition chamber, so as to prepare magnetic metal material, and the magnetic metal material prepared subsequently coats the core material to form a core-shell structure, which is deposited on the substrate to form a magnetic composite material. The thickness of the shell and the integrity of the coating are adjusted by controlling the power of the magnetic target, gas flow, and sputtering pressure in the deposition chamber. The greater the power is, the greater the thickness of the shell is, and the more complete the coating is, thereby forming a full-coated core-shell structure, and vice versa forming a semi-covered structure.

Figure 7:
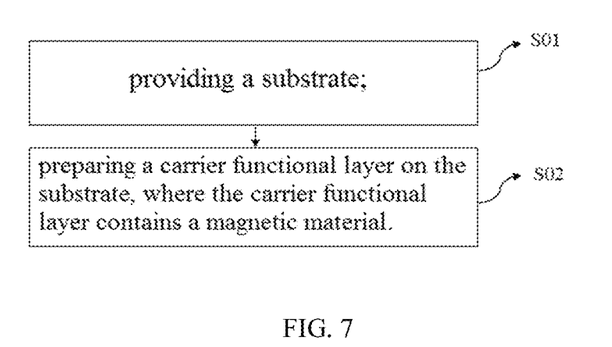
FIG. 7 is a flowchart showing a preparation method of QLED device according to an embodiment of the present disclosure.

Finally, an embodiment of the present disclosure provides a preparation method of a quantum dot Light Emitting Diode, as shown in FIG. 7, including the following steps:

S01: providing a substrate; and

S02: preparing a carrier functional layer on the substrate; where the carrier functional layer contains a magnetic material.

If the carrier functional layer containing the magnetic material is a hole adjustment layer or an electron adjustment layer, the preparation of the carrier functional layer includes: depositing a magnetic material on the substrate to obtain the carrier functional layer. If it is a hole adjustment layer, the hole adjustment layer can be prepared at any interface between the anode and the quantum dot light-emitting layer;

if it is an electron adjustment layer, the electron adjustment layer can be prepared at any interface between the cathode and the quantum dot light-emitting layer. Specifically, the selection, thickness and deposition method of the magnetic material in the hole adjustment layer or the electron adjustment layer have been described in detail above in the quantum dot Light Emitting Diode device.

If the carrier functional layer is comprised of a composite material comprised of a carrier functional material (such as hole functional material or electron functional material) and a magnetic material, the preparation of the carrier functional layer includes: depositing the composite material on the substrate to obtain the carrier functional layer. If the carrier functional layer is a hole functional layer containing a hole functional material and a magnetic material, the carrier functional layer is prepared between the anode and the quantum dot light-emitting layer, if the carrier functional layer is an electron functional layer containing an electron functional material and a magnetic material, the carrier functional layer is prepared between the cathode and the quantum dot light-emitting layer. The selection, thickness and deposition method of the above-mentioned composite material comprised of the carrier functional material and the magnetic material have been described in detail above in the quantum dot Light Emitting Diode device.

The present disclosure has been tested multiple times, and a part of the test results will now be used as a reference to further describe the present disclosure in detail, and a detailed description will be given below in combination with specific examples.

Example 1

A QLED device is provided, in which a magnetic layer made of a magnetic material is arranged between a quantum dot light-emitting layer and an electron transport layer of the QLED device, and the magnetic layer is an electron adjustment layer.

Device structure is as follows: ITO/PEDOT: PSS/Poly-TPD/PVK/Green QDs/Magnetic Layer/ZnO/Al.

The preparation method of the QLED device is as follows: PEDOT: PSS is spin coated on a glass substrate containing an ITO electrode at a speed of 5000 r.p.m. for 30 s, and heated in air for 20 min, with the thickness controlled to be about 35 nm; 1 wt % Poly-TPD dissolved in chlorobenzene is spin coated at a speed of 2500 r.p.m. for 30 s, and heated at 110° C. in nitrogen for 30 min, with the thickness controlled to be about 30 nm; 2 mg/ml PVK dissolved in toluene is spin coated at a speed of 2500 r.p.m. for 30 s, with the thickness controlled to be about 5 nm; subsequently, 30 mg/ml CdSe-CdS core-shell quantum dots dissolved in toluene is spin coated at a speed of 800 r.p.m. for 30 s, and heated at 120° C. in nitrogen for 15 min, with the thickness controlled to be about 30 nm; thereafter, a magnetic rubber material layer is prepared with the thickness controlled to be 0 nm, 1 nm, 3 nm, 5 nm by different solution concentration, in which, nano-magnetic ferrite particles and chlorinated polyethylene rubber are selected and performed with vulcanization and formation; then 30 mg/ml ZnO nanoparticles dissolved in butanol is spin coated at a speed of 4000 r.p.m. for 30 s, and heated at 120° C. in nitrogen for 30 min, with the thickness controlled to be about 30 nm; finally, an Al electrode is deposited by evaporation, with the evaporation rate controlled to be 0.3 nm/s, and the thickness controlled to be 120 nm.

Figure 8:
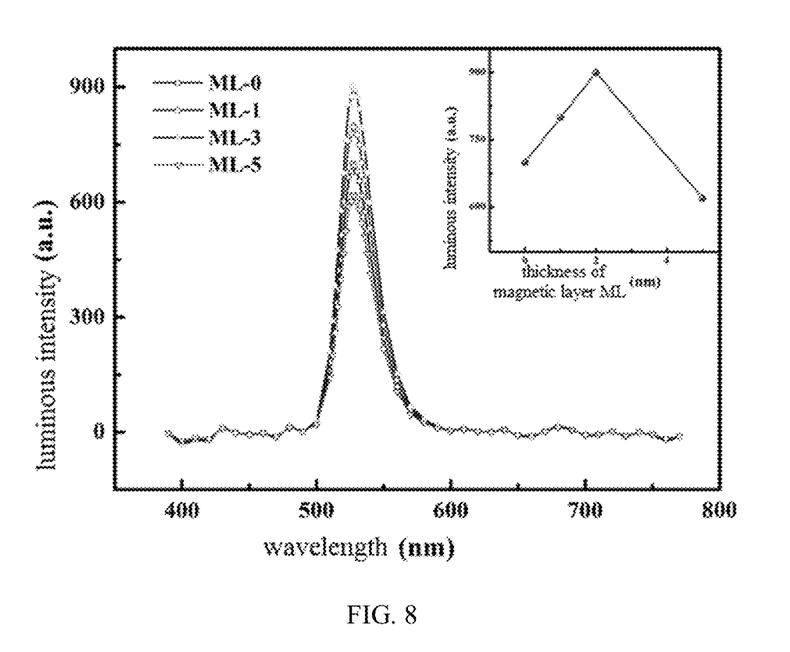
FIG. 8 shows the influence of magnetic layers with different thickness on the luminous efficiency of a QLED device in Example 1 of the present disclosure.

The performance characteristics of four different QLED devices ML-0 (with the thickness of magnetic layer to be 0), ML-1 (with the thickness of magnetic layer to be 1 nm), ML-3 (with the thickness of magnetic layer to be 3 nm), ML-5 (with the thickness of magnetic layer to be 5 nm) are shown in FIG. 8. It can be seen from FIG. 8 that the luminous intensity of the device increases first and then decreases as the thickness of the magnetic layer increases. When a thinner magnetic layer is inserted, electrons can effectively perform tunnel injection. Compared with a non-magnetic layer device, the total amount of electron injection into the light-emitting layer is reduced, which effectively reduces exciton quenching and improves carrier balance, thereby improving luminous efficiency. In addition, the surface roughness of the magnetic thin film is reduced compared with the non-magnetic layer device, the surface morphology is improved, at the same time, the insertion of the magnetic layer can effectively block the quantum dot light-emitting layer and the electron transport layer, thereby maintaining the stability of the device. However, when the magnetic layer is too thick, electron tunnel injection becomes difficult. At this time, the injection of electrons is insufficient, resulting in a decrease in the luminous efficiency of the device. With the magnetic layer of 3 nm thick, the device has the highest luminous efficiency, and its brightness increases from 8000 cd/m$^2$ to 9185 cd/m$^2$ at a current of 2 mA, which is equivalent to an EQE of 148%.

Example 2

A QLED device is provided, in which a magnetic layer made of a magnetic material is arranged between a quantum dot light-emitting layer and a hole transport layer of the QLED device, and the magnetic layer is a hole adjustment layer.

Device structure is as follows: ITO/PEDOT: PSS/Poly-TPD/PVK/Magnetic Layer/Green QDs/ZnO/Al.

The preparation method of each layer of the QLED device is similar to the above Example 1, the thickness of the magnetic layer is also controlled to be 0 nm, 1 nm, 3 nm, 5 nm, the brightness of the device at a current of 2 mA is 8000 cd/m$^2$, 10564 cd/m$^2$, 6000 cd/m$^2$, and 4000 cd/m$^2$, respectively. It can be seen that when the thickness of the magnetic layer is 1 nm, the device performance is relatively good, and the brightness is improved by 32% compared to that without an inserted magnetic layer.

Example 3

A QLED device is provided, in which a magnetic layer made of a magnetic material is arranged between a quantum dot light-emitting layer and a hole transport layer of the QLED device, and between a quantum dot light-emitting layer and an electron transport layer, that is, an electron adjustment layer and a hole adjustment layer are provided at the same time.

The structure of the QLED device in which the magnetic layers are simultaneously inserted on a side of the electron transport layer and on a side of the hole transport layer is ITO/PEDOT: PSS/Poly-TPD/NiO/Green QDs/Fe$_3$O$_4$/ZnO/Al. The preparation method of each layer of the QLED device is similar to that in Example 1 above, the thickness of the NiO layer is controlled to be 3 nm, and the thickness of the Fe$_3$O$_4$ layer is controlled to be 5 nm. The brightness of the device is 8200 cd/m$^2$ at a current of 2 mA, which is improved by 5% compared with a brightness of 7800 cd/m$^2$ without a magnetic layer.

Example 4

Figure 9:
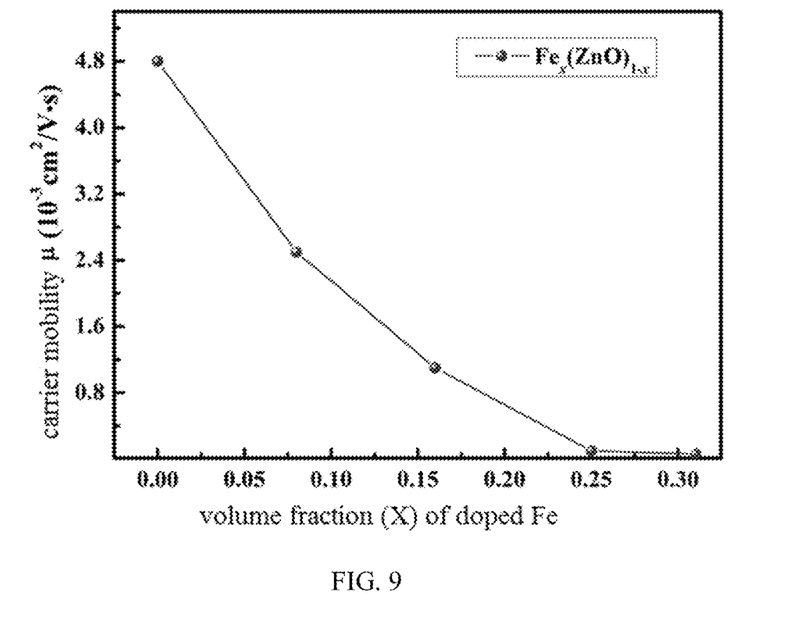
FIG. 9 shows the influence of iron doping on the carrier mobility of a zinc oxide thin film in Example 4 of the present disclosure.

A pair of high-purity zinc oxide targets with a purity of 99.999% and a nanoparticle beam composite thin film deposition equipment are used to prepare a zinc oxide nanoparticle thin film. The thickness of the thin film is about 40 nm, and the size of the zinc oxide nanoparticles is about 5-10 nm. Subsequently, the physical property measurement system (PPMS) is used to measure the carrier mobility at room temperature and a magnetic field of 1000 Oe. While depositing the zinc oxide nanoparticle thin film, a common magnetron sputtering target is also installed in the deposition chamber to dope a magnetic material, here, an iron target is selected, therefore a zinc oxide thin film doped with magnetic metal iron can also be prepared. The thickness of the thin film and the size of the nanoparticles are also controlled within the above-mentioned parameters, then the carrier mobility is also measured by the PPMS, and the measurement results are shown in FIG. 9. As can be seen from FIG. 9, after doping the zinc oxide thin film with a magnetic material, the carrier mobility decreases, the higher the content of the magnetic material is, the greater the carrier mobility decreases, and the range of change reaches an order of magnitude.

Example 5

A QLED device is provided, and the structure thereof is: ITO/PEDOT: PSS/TFB/Green QDs/$Fe_x(ZnO)_{1-x}$/Al.

Referring to the above Example 4 for the preparation method of magnetic-material-Fe-doped ZnO, where, the volume fraction of Fe is 0%, 8%, 16%, 25%, and 31%, respectively. The performance of the QLED device is shown in FIG. 10.

Figure 10:
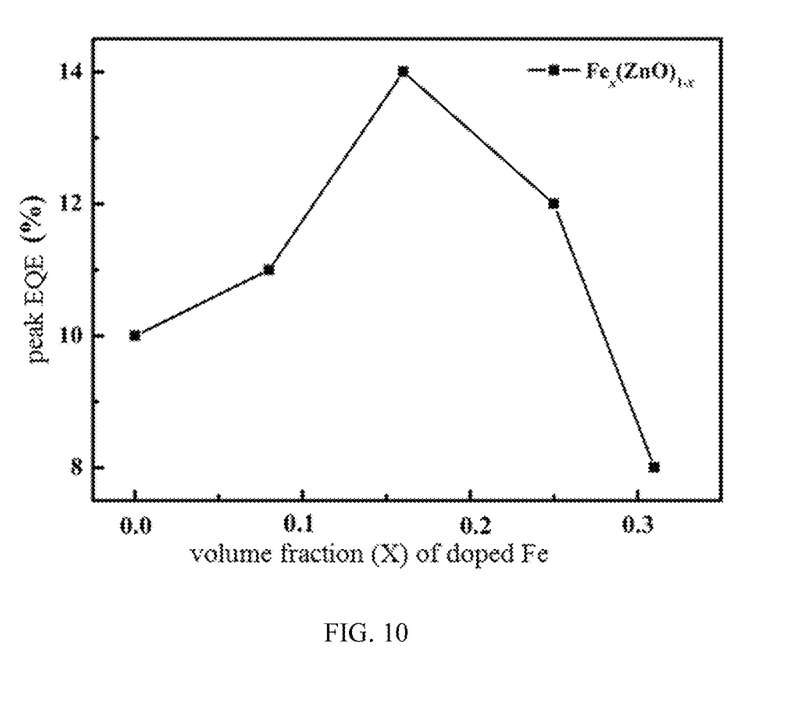
FIG. 10 shows the influence of iron doping on the luminous efficiency of a QLED device in Example 5 of the present disclosure.

As can be seen from FIG. 10, the luminous efficiency of the QLED device increases first and then decreases as the volume fraction of the magnetic material Fe increases. As can be seen from FIG. 10 in Example 4, as the volume fraction of the magnetic component Fe increases, the carrier mobility gradually decreases. Generally, in red-green devices, electron injection is generally superior to hole injection, which leads to the dominance of electrons in the number of carriers, thereby causing the quenching effect of residual electrons on excitons. Therefore, by changing the electron mobility, the carrier injection balance of the light-emitting layer is improved, thereby improving the luminous efficiency of the above device. In this example, when the content of the magnetic material continues to increase, the carrier mobility continues to decrease at this time, resulting in insufficient electrons in the light-emitting layer, and the residual holes have a strong quenching effect on excitons, resulting in a rapid decrease in the luminous efficiency.

Example 6

Figure 11:
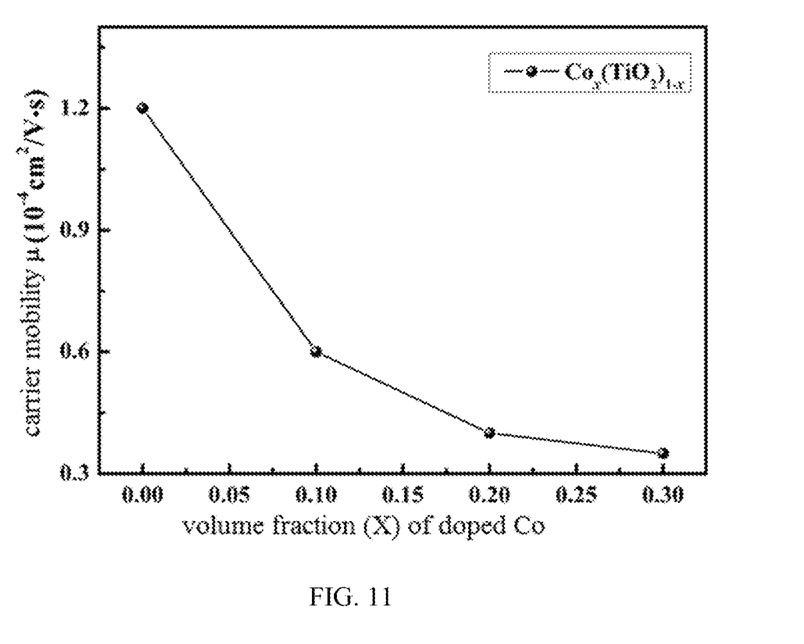
FIG. 11 shows the influence of cobalt doping on the carrier mobility of a titanium oxide thin film in Example 6 of the present disclosure.

Using the same method as in Example 4, the zinc oxide targets are replaced with titanium oxide targets, and the iron target is replaced with a cobalt target, so as to prepare a titanium oxide nanoparticle thin film and titanium oxide nanoparticle thin films containing different volume fractions of magnetic material cobalt. Subsequently, the carrier mobility is also measured by the PPMS, and the measurement results are shown in FIG. 11. As can be seen from FIG. 11, after the titanium oxide film is doped with the magnetic material cobalt, the carrier mobility decreases accordingly, and the higher the content of the magnetic material is, the greater the carrier mobility decreases.

Example 7

A QLED device is provided, and the structure thereof is: ITO/PEDOT: PSS/TFB/Red QDs/$Co_x(ZnO)_{1-x}$/Al.

The preparation method of magnetic-material-Co-doped electron transport layer $Co_x(ZnO)_{1-x}$ is as follows. Firstly, ZnO nanorods are prepared on a prepared substrate containing ITO/PEDOT: PSS/Poly-TPD/PVK/QDs by Metal-Organic Vapor-Phase Epitaxy (MOVPE), then Co is deposited on the ZnO nanorods by evaporation to prepare a $Co_x(ZnO)_{1-x}$ magnetic material layer, and finally Al electrode is deposited by evaporation to form QLED a device. In the test, the volume fraction of Co can also be controlled by controlling the size of ZnO nanorods and the evaporation rate of Co, and devices with the volume fractions of Co to be 0%, 5%, 12%, 24%, 31%, and 35% are prepared, the performance characteristics of which are shown as FIG. 12.

Figure 12:
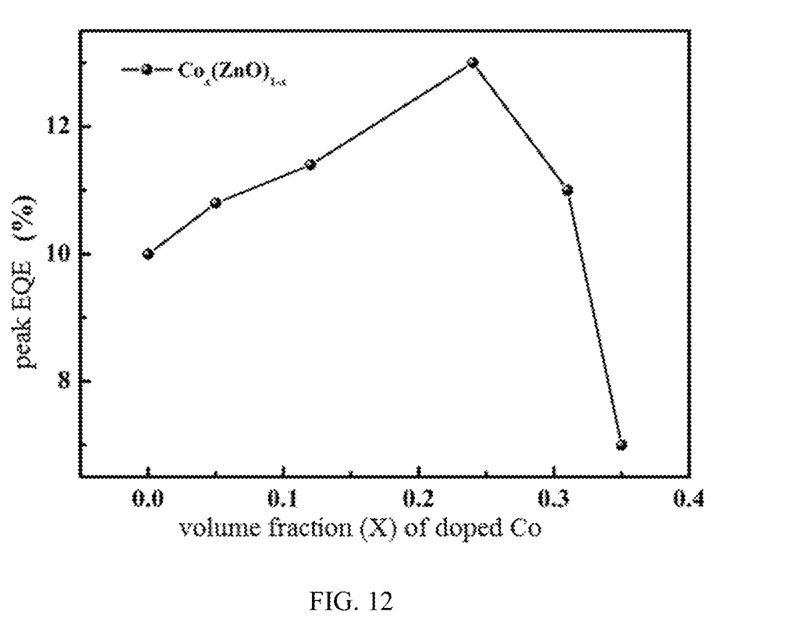
FIG. 12 shows the influence of iron doping on the luminous efficiency of a QLED device in Example 7 of the present disclosure.

As can be seen from FIG. 12, the luminous efficiency of the QLED device increases first and then decreases as the volume fraction of the magnetic material Co increases. As can be seen from FIG. 11 in Example 6, the increase of the magnetic material Co causes the carrier mobility to decrease, thereby improving the carrier injection balance of the light-emitting layer and improving the luminous efficiency. In this example, when the content of the magnetic material continues to increase, the number of electrons in the light-emitting layer is insufficient, resulting in a rapid decrease in the luminous efficiency. When the volume fraction of Co is 24%, the EQE of the device has a maximum value of 13%, compared with the volume fraction of Co of 0%, that is, a device doped with no magnetic material (EQE 10%), the EQE increases by 33.3%.

Example 8

Figure 13:
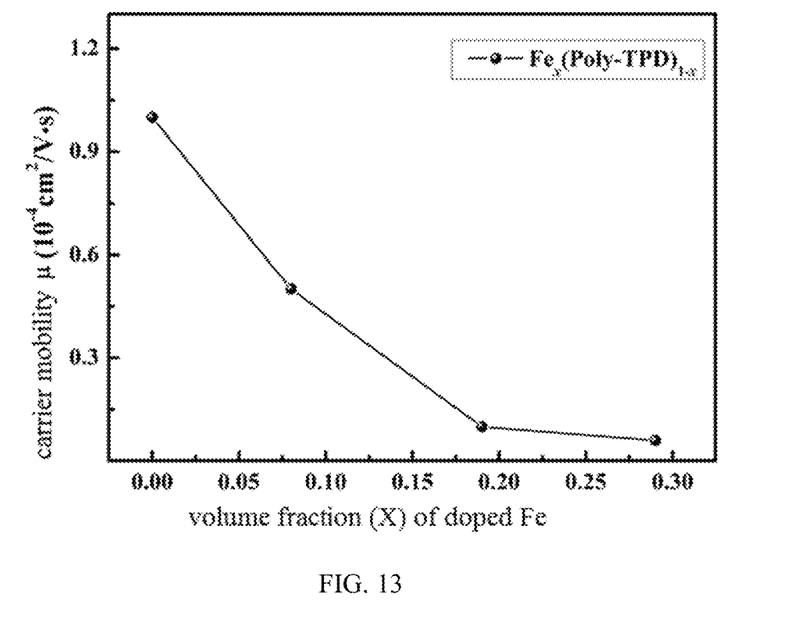
FIG. 13 shows the influence of iron doping on the carrier mobility of Poly-TPD thin film in Example 8 of the present disclosure.

An organic-metal thermal evaporation coating machine is used to co-evaporate a magnetic material iron and an organic material Poly-TPD, so as to prepare a magnetic-material-iron-doped Poly-TPD organic thin film. Before evaporation, two iron grains are placed in a tungsten boat, and the organic material Poly-TPD is placed in the other material evaporation boat, and different power sources and different powers are used to control the content of the magnetic material. The thickness of the prepared thin film is about 30 nm, and the content of the magnetic material is 0%-35%. Subsequently, the PPMS is also used to measure the carrier mobility of the thin film. The measurement conditions are the same as in Example 4, and the measurement results are shown in FIG. 13. As can be seen from FIG. 13, as the content of the magnetic material component increases, the carrier mobility decreases accordingly.

Example 9

A QLED device is provided, and the structure thereof is: ITO/PEDOT: PSS/$Fe_x(Poly-TPD)_{1-x}$/PVK/Blue QDs/ZnO/Al.

The preparation method of magnetic-material-Fe-doped hole transport layer $Fe_x(Poly-TPD)_{1-x}$ is as shown in Example 8. In the test, the volume fraction of Fe can also be controlled by controlling the evaporation rate of Fe and Poly-TPD, and devices with the volume fractions of Fe to be 0%, 7%, 18%, 28%, and 33% are prepared, the performance characteristics of which are shown as FIG. 14.

Figure 14:
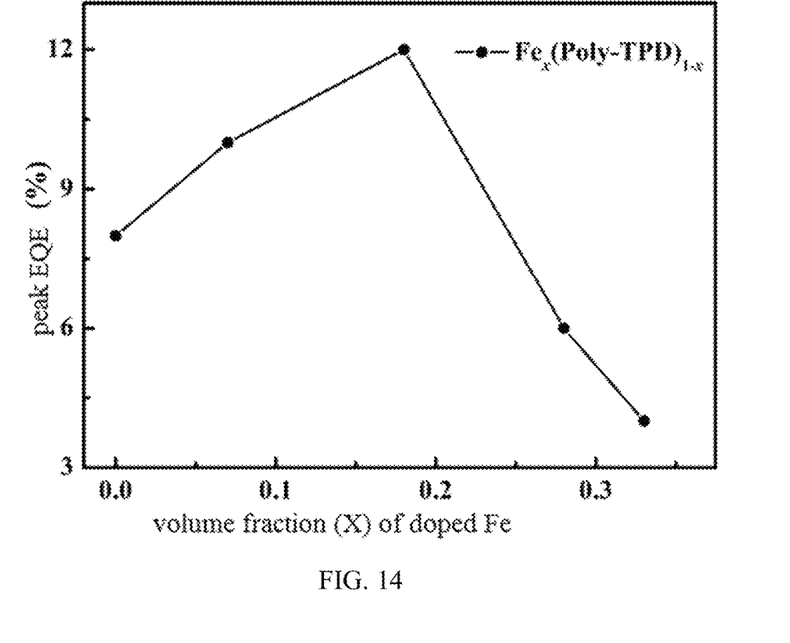
FIG. 14 shows the influence of iron doping on the luminous efficiency of a QLED device in Example 9 of the present disclosure.

As can be seen from FIG. 14, the luminous efficiency of the device increases first and then decreases as the volume fraction of the magnetic material Fe increases. As can be seen from FIG. 13 in Example 8, as the volume fraction of the magnetic component Fe increases, the carrier mobility gradually decreases. Generally in blue light devices, due to the wide energy gap of blue-emitting quantum dots, the electron affinity of the outer shell layer is low, and the electron affinity of the commonly used electron transport layer material zinc oxide nanoparticles is about 3.5 eV, electron injection and transport will be weaker than holes, as a result, more exciton-hole three-particle systems are generated. The hole has a stronger quenching effect on excitons than electrons, so blue light devices with insufficient electron injection will face more severe (compared to red and green light devices with insufficient hole injection) exciton quenching. Therefore, the hole mobility is changed by doping a magnetic material so as to improve the carrier injection balance of the light-emitting layer, thus the light emitting efficiency can be improved. In this example, when the content of the magnetic material continues to increase, the carrier mobility continues to decrease at this time, which leads to an insufficient number of holes in the light-emitting layer, thereby resulting in a rapid decrease in the luminous efficiency. By adjusting the content of the magnetic material, the maximum luminous efficiency is obtained when the volume fraction of Fe is 18%, the EQE reaches 12%, which is 150% higher than that of the device doped with no magnetic material (EQE 8%).

Example 10

Magnetic particles & N-type semiconductor, co-dispersed to form an electron transport layer.

Co-sputtering is directly used to prepare magnetic particles/N-type semiconductor heterojunction structure. Using a Fe target with a purity of 99.99% and a ZnO target for co-sputtering, the sputtering rate can be controlled by the power of the two targets, and heterojunction structure composite materials containing magnetic materials with different volume fractions of Fe can be prepared. By preparing the device with the structure of ITO/MoO$_3$/Green QDs/ZnO—Fe/Al, and then comparing the device prepared with ZnO without Fe doping, it is found that the EQE increased from 10% to 20%.

Example 11

Magnetic particles & P-type semiconductor, co-dispersed to form a hole transport layer.

Co-sputtering is used directly to prepare magnetic particles/P-type semiconductor heterojunction structure. Using a Fe target with a purity of 99.99% and a MoO$_3$ target for co-sputtering, the sputtering rate can be controlled by the power of the two targets, and heterojunction structure composite materials containing magnetic materials with different volume fractions of Fe can be prepared. By preparing the device with the structure of ITO/MoO$_3$—Fe/Green QDs/ZnO/Al, and then comparing the device prepared with MoO$_3$ without Fe doping, it is found that the EQE increased from 8% to 17%.

Example 12

A magnetic material is coated on a N-type semiconductor to form a hole transport layer with a core-shell structure.

The method in Example 4 can be used to prepare Fe-coated ZnO nanoparticles with different thicknesses. The structure of the QLED device is ITO/PEDOT: PSS/TFB/Green QDs/ZnO @ Fe/Al, where the volume fraction of Fe is 0%, 8%, 16%, 25%, 31%, corresponding to a different Fe shell with a thickness of 0 nm, 3 nm, 5 nm, 8 nm, and 10 nm, respectively. Referring to Example 5 for the specific performance characterization of devices. As can be known, the carrier mobility can by changed by adjusting the thickness of the magnetic layer, thereby improving the luminous performance of the device and improving EQE.

Example 13

A magnetic material is coated on a P-type semiconductor to form an electron transport layer with a core-shell structure.

Similarly, the method in Example 4 can be used to prepare Fe-coated MoO$_3$ nanoparticles with different thicknesses. The structure of the QLED device is ITO/MoO$_3$ @ Fe/Green QDs/ZnO/Al, and then compared with the device prepared with MoO$_3$ without Fe coating, it is found that the EQE increased from 8% to 13%.

The above are only preferred embodiments of the present disclosure and are not intended to limit the present disclosure. Any modification, equivalent replacement and improvement made within the spirit and principle of the present disclosure should be included within the protection scope of the present disclosure.

What is claimed is:

1. A quantum dot Light Emitting Diode, comprising an anode, a cathode and a quantum dot light-emitting layer between the anode and the cathode, a carrier functional layer being arranged between the anode and the cathode, wherein the carrier functional layer contains a composite material of a magnetic material and a carrier functional material; and
   wherein the magnetic material is coated on a surface of the carrier functional material to form a core-shell structure of which an inner core is the carrier functional material and a shell is the magnetic material.

2. The quantum dot Light Emitting Diode according to claim 1, wherein the carrier functional layer is arranged between the cathode and the quantum dot light-emitting layer, and the carrier functional layer is an electron functional layer, and the carrier functional material is an electron functional material, and the electron functional layer contains the electron functional material and the magnetic material; wherein the electron functional material is an electron injection material or an electron transport material.

3. The quantum dot Light Emitting Diode according to claim 2, wherein a thickness of the shell is 1-12 nm; or
   a thickness of the carrier functional layer is 20-40 nm; or
   a volume fraction of the magnetic material in the carrier functional layer is 0.5%-30%.

4. The quantum dot Light Emitting Diode according to claim 1, wherein the carrier functional layer is arranged between the anode and the quantum dot light-emitting layer, and the carrier functional layer is a hole functional layer, and the carrier functional material is a hole functional material, and the hole functional layer contains the hole functional material and the magnetic material; wherein the hole functional material is a hole injection material or a hole transport material.

5. The quantum dot Light Emitting Diode according to claim 4, wherein a thickness of the shell is 1-12 nm; or
   the thickness of the carrier functional layer is 20-40 nm; or
   a volume fraction of the magnetic material in the carrier functional layer is 0.5%-30%.

6. A quantum dot Light Emitting Diode, comprising an anode, a cathode and a quantum dot light-emitting layer between the anode and the cathode, a carrier functional layer being arranged between the anode and the cathode, wherein the carrier functional layer contains a magnetic material, wherein the carrier functional layer is arranged between the cathode and the quantum dot light-emitting layer, and the carrier functional layer is an electron adjustment layer, the electron adjustment layer contains the magnetic material; or wherein the carrier functional layer is further arranged between the anode and the quantum dot light-emitting layer, and the carrier functional layer is a hole adjustment layer containing the magnetic material.

7. The quantum dot Light Emitting Diode according to claim 6, wherein when the carrier functional layer is the electron adjustment layer, an electron transport layer is arranged between the cathode and the quantum dot light-emitting layer; the electron adjustment layer is located between the cathode and the electron transport layer, or the electron adjustment layer is located between the electron transport layer and the quantum dot light-emitting layer; or an electron injection layer and an electron transport layer are stacked between the cathode and the quantum dot light-emitting layer, the electron injection layer is adjacent to the cathode, and the electron transport layer is adjacent to the quantum dot light-emitting layer; the electron adjustment layer is located between the cathode and the electron injection layer, or the electron adjustment layer is located between the electron injection layer and the electron transport layer, or the electron adjustment layer is located between the electron transport layer and the quantum dot light-emitting layer.

8. The quantum dot Light Emitting Diode according to claim 6, wherein when the electron adjustment layer is comprised of a conductive magnetic material, a thickness of the electron adjustment layer is 1-10 nm; or when the electron adjustment layer is comprised of an insulating magnetic material, a thickness of the electron adjustment layer is 1-5 nm.

9. The quantum dot Light Emitting Diode according to claim 6, wherein when the carrier functional layer is the hole adjustment layer, a hole transport layer is arranged between the anode and the quantum dot light-emitting layer, and the hole adjustment layer is located between the anode and the hole transport layer, or the hole adjustment layer is located between the hole transport layer and the quantum dot light-emitting layer; or a hole injection layer and a hole transport layer are stacked between the anode and the quantum dot light-emitting layer, the hole injection layer is adjacent to the anode, and the hole transport layer is adjacent to the quantum dot light-emitting layer; the hole adjustment layer is located between the anode and the hole injection layer, or the hole adjustment layer is located between the hole injection layer and the hole transport layer, or the hole adjustment layer is located between the hole transport layer and the quantum dot light-emitting layer.

10. The quantum dot Light Emitting Diode according to claim 6, wherein when the hole adjustment layer is comprised of a conductive magnetic material, a thickness of the hole adjustment layer is 1-10 nm; or when the hole adjustment layer is comprised of an insulating magnetic material, a thickness of the hole adjustment layer is 1-5 nm.

11. The quantum dot Light Emitting Diode according to claim 1, wherein the magnetic material comprises a conductive magnetic material, or an insulating magnetic material, or a conductive magnetic material and an insulating magnetic material; and a saturation magnetization of the magnetic material is greater than 80 emu/g; and a particle diameter of the magnetic material is 8-15 nm.

12. The quantum dot Light Emitting Diode according to claim 11, wherein the magnetic material is selected from conductive magnetic materials, and the conductive magnetic material is at least one selected from the group consisting of elemental iron, an iron alloy, an iron oxide, elemental cobalt, a cobalt alloy, a cobalt oxide, elemental nickel, a nickel alloy, and a nickel oxide; or the magnetic material is selected from insulating magnetic materials, and the insulating magnetic material is at least one selected from a group consisting of a ferrite and a magnetic rubber.

13. A composite material, wherein the composite material is comprised of a carrier functional material and a magnetic material; and wherein the magnetic material is coated on a surface of the carrier functional material to form a core-shell structure of which an inner core is the carrier functional material and a shell is the magnetic material.

14. The composite material according to claim 13, wherein the carrier functional material is a hole functional material, and the composite material is comprised of the hole functional material and the magnetic material; wherein, the hole function material is a hole injection material or a hole transport material.

15. The composite material according to claim 13, wherein the carrier functional material is an electron functional material, and the composite material is comprised of the electron functional material and the magnetic material; wherein, the electron functional material is an electron injection material or a hole transport material.

* * * * *